(12) United States Patent
Werthner et al.

(10) Patent No.: US 6,252,401 B1
(45) Date of Patent: Jun. 26, 2001

(54) METHOD FOR RECONSTRUCTING A PLANAR TOMOGRAM FROM MAGNETIC RESONANCE SIGNALS IN AN INHOMOGENEOUS MAGNETIC FIELDS

(75) Inventors: Harald Werthner, Zirndorf; Roland Faber, Uttenreuth, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/343,177

(22) Filed: Jun. 30, 1999

(30) Foreign Application Priority Data

Jul. 3, 1998 (DE) .............................................. 198 29 850

(51) Int. Cl.$^7$ .............................. G01V 3/00; G01R 33/20
(52) U.S. Cl. ........................................ 324/309; 324/307
(58) Field of Search ................................... 324/309, 318, 324/312, 306, 307, 322, 314

(56) References Cited

U.S. PATENT DOCUMENTS

| | | | |
|---|---|---|---|
| 4,703,270 | * 10/1987 | Hall et al. | 324/309 |
| 4,851,779 | * 7/1989 | DeMeester et al. | 324/312 |
| 4,908,573 | * 3/1990 | Kaufman et al. | 324/309 |
| 5,509,412 | * 4/1996 | Bahn | 600/419 |
| 5,757,187 | * 5/1998 | Wollin | 324/306 |
| 5,886,524 | 3/1999 | Krieg | 324/312 |
| 5,903,149 | * 5/1999 | Gonen et al. | 324/307 |

FOREIGN PATENT DOCUMENTS

WO 95/30908   11/1995   (WO).
WO 97/04329 * 2/1997   (WO).

OTHER PUBLICATIONS

"Effects Of Gradient Anisotropy In MRI," Aldefeld et al, MRM, vol. 39 (1998), pp. 606–614.
"Simulation Of The Influence Of Magnetic Field Inhomogeneity And Distortion Correction In MR Imaging," Weis et al, Magnetic Resonance Imaging, vol. 8 (1990), pp. 483–489.

* cited by examiner

Primary Examiner—Christine Oda
Assistant Examiner—Tiffany A. Fetzner
(74) Attorney, Agent, or Firm—Schiff Hardin & Waite (57) ABSTRACT

In a method for reconstructing a planar tomogram of an examination subject from magnetic resonance signals in inhomogeneous magnetic fields, original image elements are generated by means of multi-slice excitation, with the original image elements being disposed in the examination subject in several curved slices which are adjacent to one another in succession, the spatial position of the original image elements, are determined and image elements of a planar tomogram are generated from the original image elements which are arranged in an environment of the respective image elements.

11 Claims, 6 Drawing Sheets

METHOD FOR RECONSTRUCTING A PLANAR TOMOGRAM FROM MAGNETIC RESONANCE SIGNALS IN AN INHOMOGENEOUS MAGNETIC FIELDS

BACKGROUND OF THE INVENTION

1. Field of the Invention

The present invention relates to a method for reconstructing a planar tomogram of an examination subject from magnetic resonance signals in an inhomogeneous magnetic field with a magnetic resonance device that has a known inhomogeneous main magnetic field and/or at least one known non-linear gradient magnetic field.

2. Description of the Prior Art

Imaging by means of magnetic resonance techniques makes use of the frequency dependency of the magnetic resonance signal on the magnetic field strength for purposes of spatial resolution. Common methods for reconstructing tomograms presume a homogenous main magnetic field and strictly linear gradient magnetic fields. Inhomogeneities of the main magnetic field cause distortions or deformations in the frequency encoding direction. Given non-linearities of the gradient fields, the distortions are present not only in the tomographic image plane, but also perpendicular thereto, given slice excitations with a selection gradient. The distortions or deformations relate to the geometric position of the reconstructed spin density in the examination subject and likewise to the reconstructed image intensity.

Heretofore, distortions have been corrected in the image plane, exclusively. PCT Application WO 95/30908 teaches a method wherein a generalized Fresnel transformation is performed in the readout direction (GFT reconstruction). The GFT transformation takes into account a known location dependency of the main magnetic field in the readout direction.

The method described in German OS 195 40 837 uses two auxiliary data records which describe a shifting of the measured location relative to an actual location of a signal origin. From one of the auxiliary data records, a corrected auxiliary data record is created. In an image data record, a location correction then occurs in a first coordinate direction using the corrected auxiliary data record. A first intensity correction also occurs. Subsequently, a location correction in the second coordinate direction occurs, along with a second intensity correction. Alternatively, the location correction can occur by a Fresnel transformation of the raw data record including the corrected auxiliary data.

The article "Simulation of the influence of magnetic field inhomogeneity and distortion correction in MR imaging" (J. Weiss, L. Budinsky, *Magnetic Resonance Imaging*, 8, 1990: 483–489) teaches the correction of image distortions by a postprocessing of a conventionally acquired image. The information about magnetic field inhomogeneities which is required for this is obtained from the phase of separately registered spin-echo images. Deformations in the slice direction, i.e. slice curvatures, cannot be corrected with this method.

The slice curvature problem with respect to the main magnetic field non-homogeneity conventionally has been avoided by a 3D imaging wherein a spatial resolution occurs in the slice direction by means of an additional phase encoding. The phase encoding is relatively insensitive to main magnetic field inhomogeneities relating to deformations. The longer measuring time compared to multi-slice pickups and the resulting higher susceptibility to movement artefacts are disadvantageous, however. There are consequently fundamental restrictions in the application of certain techniques which are based on a rapid imaging, such as contrast agent examination or dynamic studies. Deformations relating to non-linear gradient fields heretofore have remained uncorrected.

SUMMARY OF THE INVENTION

An object of the present invention is to provide a method for reconstructing a planar tomogram from magnetic resonance signals in inhomogeneous magnetic fields, with which method deformations in the direction of the main magnetic field also can be corrected.

The object is achieved in a method in accordance with the invention having the following steps. Original image elements are generated by means of multi-slice excitation, these original image elements being generated from magnetic resonance signals of original volume elements that are arranged in the examination subject in several curved layers that are disposed adjacent to one another succession. The spatial position of the original image elements is determined by means of the known magnetic fields. Image elements of a planar tomogram are generated, these image elements being representative of the volume elements of a planar slice that is situated within the curved slice, from the original image elements which are arranged in an environment of the respective image elements.

The term "original volume element" means the measured, i.e. distorted, volume element (voxel). "Volume element "means the real, undistorted voxel, which agrees with the measured one given ideal magnetic fields.

First, several neighboring slices which are deformed by non-ideal magnetic fields are measured. From this, at least one planar slice which is free of deformations is reconstructed. Altogether, the multi-slice excitation covers a 3D volume which, in contrast to the ideal case wherein the main magnetic field is homogeneous and the gradient magnetic fields are strictly linear, does not form a cuboid, but instead forms a region bounded by curvilinear surfaces. An advantage of the inventive method is a complete correction of deformations due to basic field inhomogeneities and gradient field non-linearities in all three spatial directions. This produces a functionality as in the ideal case. The position of the image elements indicates the actual anatomical position. Thus, for example, distance measurements in the entire image region are anatomically accurate. The slices of 3D-corrected measurements can then be graphically positioned onto 2D-corrected or 3D-corrected reference images with straight auxiliary lines, without further difficulty.

In one embodiment the image elements have respective intensity values, and the original image elements have respective original intensity values, and the intensity values are generated from surrounding original intensity values which are weighted with allocated weight factors. The preparation of the planar tomograms from the measured 3D volumes which are deformed due to non-ideal magnetic fields occurs using reconstruction methods which are derived from the known multiplanar reconstruction methods. The required precise spatial position of the original volume elements is obtained from coefficient tables of an allocated series expansion of the magnetic field, as are already used in the deformation correction in an image plane. Given main magnetic field inhomogeneities and gradient field non-linearities, the position of an image element is shifted. Together with the shift in the tomographical plane itself, which already can be calculated with the algorithms of the 2D deformation correction, the spatial position can be determined for each image element in a slice and for all neighboring slices using the coefficient tables. The spatial position of the original image elements enter into the method for multiplanar reconstruction as input values, in order to reconstruct a planar slice therefrom.

In another embodiment the weighting factors are determined by corresponding volume contents of the original volume element and the volume element. Given sharp deviations of the magnetic fields from the ideal distribution, the different volume contents of the original volume elements and the volume elements are taken into consideration in the methods for multiplanar reconstruction.

In a further embodiment, the volume contents are taken into account in the weighting factors by determining the weighting factors as a ratio of the volume contents of the respective volume elements relative to the volume contents of respective original volume elements.

In another embodiment, the weight factors are respectively formed by the volume contents of an overlap volume of the volume element and the original volume element relative to the original volume element. All original image elements that surround the image element to be reconstructed thus can be taken into account in the reconstruction.

The volume ratio of the original volume elements and the volume elements can also be determined in another embodiment by the weighting factors, obtained directly from the gradient magnetic field and main magnetic field at the location of the original volume element. Since the original volume elements are generally not limited to a plane in a straight line, the determination of the volume contents can require an increased computing outlay. This problem is avoided if the correction of the deformed intensity is calculated by the analytical term into which the gradient and main magnetic fields are entered.

The computing time for reconstruction can be minimized when conventional methods for multiplanar reconstruction are utilized. This is possible according to a further embodiment by transforming the original image elements into a curvilinear coordinate system in which the original image elements are arranged on a cubic raster, and by also transforming the image elements of the planar slice into the curvilinear coordinate system, and by forming the weighting factors as the ratio of the volume contents of the volume element relative to the volume contents of the original volume element.

DESCRIPTION OF THE PREFERRED EMBODIMENTS

Figure 1:
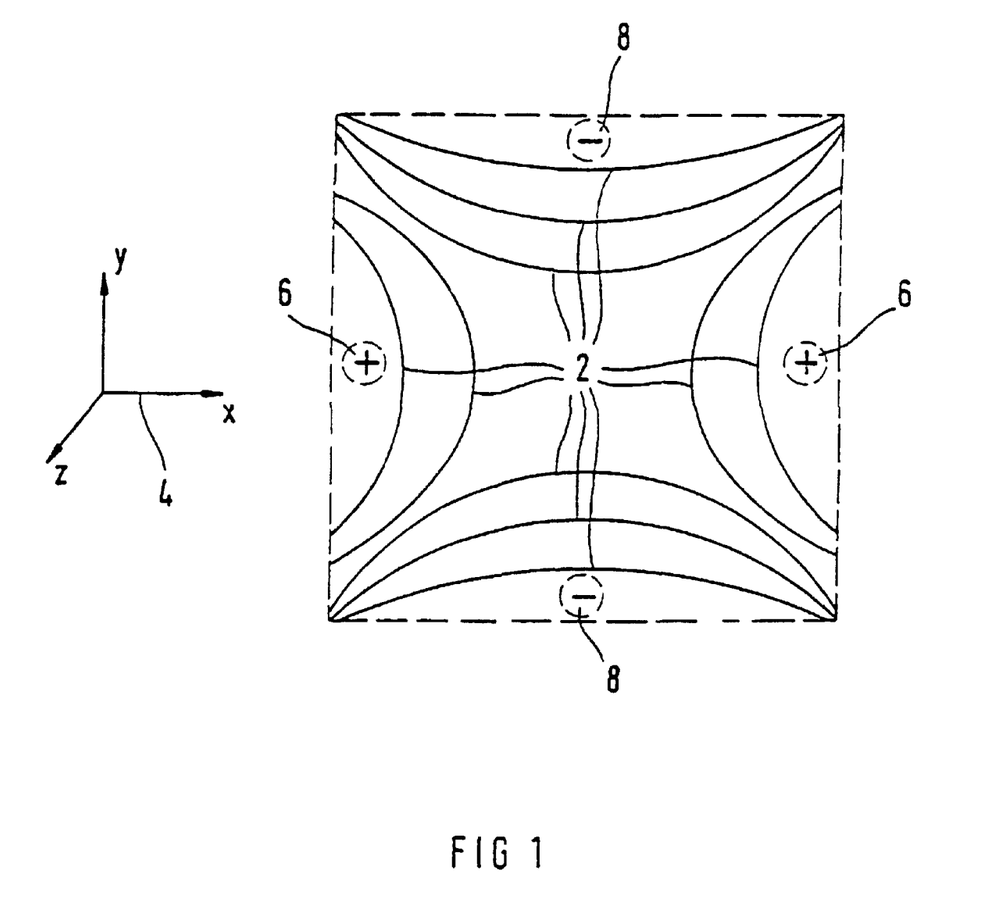
FIG. 1 shows the isocontour lines of an inhomogeneous total magnetic field as arises in a magnetic resonance tomography apparatus.

FIG. 1 schematically depicts isocontour lines 2 of the magnitude of the field strength of an inhomogeneous total magnetic field in an xy plane perpendicular to the direction of a main magnetic field in an imaging volume of a diagnostic magnetic resonance device. For clarification, a complete xyz coordinate system 4 is illustrated. The inhomogeneous total field is composed of the inhomogeneous main magnetic field and on-linear gradient fields. A plus sign 6 references an increased field strength with respect to a central region, while a minus sign 8 references a lower field strength. Since the frequency of the magnetic resonance signals is set proportional to the magnetic field strength, a location shift in the imaging arises in conventional reconstruction methods, via the frequency encoding, due to the inhomogeneous total field. The frequency encoding occurs in a slice selection and in the readout of the magnetic resonance signals. In the direction of the phase encoding, deviations from the ideal main magnetic field are generally not harmful, since only phase differences are evaluated. Typically, the magnetic field is characterized by a series expansion using Legendre polynomials. The corresponding measured or calculated coefficients are inserted here into the appertaining polynomial expansion. The magnetic field thus is obtained dependent on the spatial coordinates. The inhomogeneous field portions can be determined according to the following method, for example.

The inhomogeneous field portions of basic and gradient fields in a magnetic resonance system are measured or calculated.

The total field is represented as a series development using Legendre polynomials and the coefficients are stored in a file.

For the measured slices, the local, inhomogeneous field values are determined, using the Legendre series expansion, from the position vectors of the original image elements of the measured slices and from the coefficient file.

Figure 2:
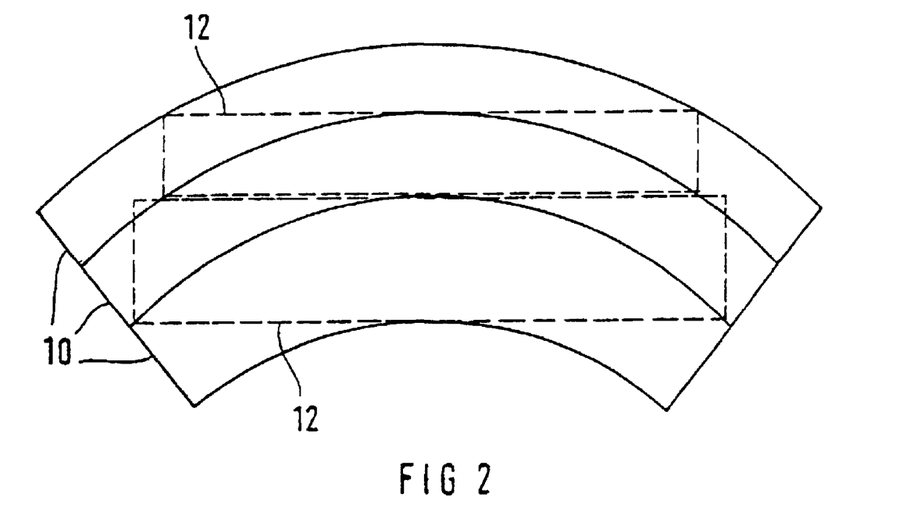
FIG. 2 is a basic illustration of non-planar slices which are obtained in the presence of an inhomogeneous total field as shown in FIG. 1.

FIG. 2 shows, in a sectional view, that curved slices 10 which are excited in an exemplary inhomogeneous total magnetic field (FIG. 1), are not planar, but curved. In addition, the slice thickness can vary. Three adjoining slices 10 are illustrated as examples in cross-section in FIG. 2. The excitation of the neighboring slices 10 occurs via multi-slice sequences, nearly all known sequences being in principle multi-slice-capable, with the marginal condition that in inhomogeneous fields, spin-echo sequences deliver better results than do gradient echo sequences. Multi-slice spin-echo sequences and multi-slice turbo-spin-echo sequences, as well as multi-slice HASTE sequences, are preferably used. Altogether, a 3D volume is covered via the multi-slice excitation which, contrary to the homogenous case wherein the main magnetic field is constant and the gradient magnetic fields are strictly linear, does not form a cuboid, but instead forms a region bounded by curved surfaces. Images are now reconstructed of planar slices 12 which are situated within the deformed slice 10. The planar slices 12 are also illustrated in cross-section in FIG. 2. In the reconstruction, deformations due to main field inhomogeneities and gradient field inhomogeneities in all three spatial directions are corrected.

Figure 3:
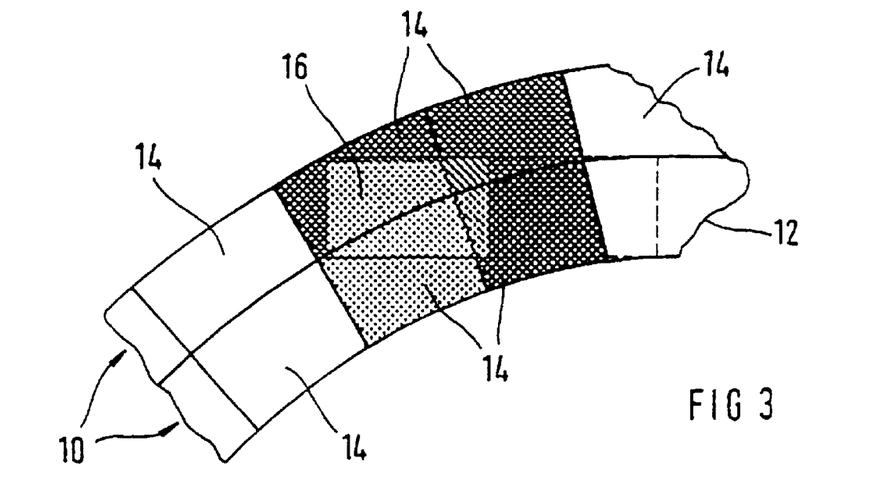
FIG. 3 illustrates image elements of a planar slice and non-planar slices.

FIG. 3 depicts a cross-section of a section of the curved slice 10, in which the planar slice 12 to be reconstructed is arranged. The curved slice 10 is formed by adjoining original volume elements 14 which are bounded by curved surfaces. By means of multi-slice excitation, original image elements for a tomogram representation are generated, which render the spin density of the original volume elements 14. The spatial positions of the original volume elements, and thus the positions of the original image elements in the tomogram, are obtained from the known magnetic field course. Besides the spatial position, the original image elements include an intensity value as a measure of the spin density in the form of a grayscale value. From the original image elements, image elements of a planar tomogram are constructed, which are representative of volume elements 16 of the planar slice 12 within the curved slice 10. for this purpose, image data are evaluated of the original volume elements 14, which are in an environment of the volume elements 16 to be represented. Four adjoining original volume elements 14 are shown in hatched fashion as examples in FIG. 3, from whose image information the image element that is representative of the volume element 16 of the planar slice 12 is reconstructed. The intensity value or grayscale value of the reconstructed image element is derived from weighted grayscale values of the original volume elements 14.

For the reconstruction, the methods detailed below are used, these being derived from the multiplanar reconstruction (MPR). These methods can be generally represented as follows: If i(p) is the intensity value of an original image element for a point p in space with the coordinates x, y, z, then the intensity value i' of an image element at the point p' with the coordinates x',y', z', which does not correspond to the point p, is defined by a function f of the intensity values of the original image elements at n environmental points $p_1$ to $P_n$:

$$i'(p')=f(i(p_1), \ldots, i(p_n))$$

The function f is often a linear combination of the intensity values of the original image elements with suitable weight factors $a_k$:

$$i'(p')=a_1 i(p_1)+ \ldots +a_k i(p_k)+ \ldots +a_n i(p_n).$$

In the conventional methods of MRP, the factors $a_k$ are derived from a distance value $$d_k=|p'-p_k|.$$

Thus, in the case of the 2D reconstruction in a conventional correction method, which is referred to as a nearest neighbor method, only the intensity value of the original image element situated nearest the image element to be reconstructed is used. The intensity values of the other neighboring image elements are not taken into account in the reconstruction.

Figure 4:
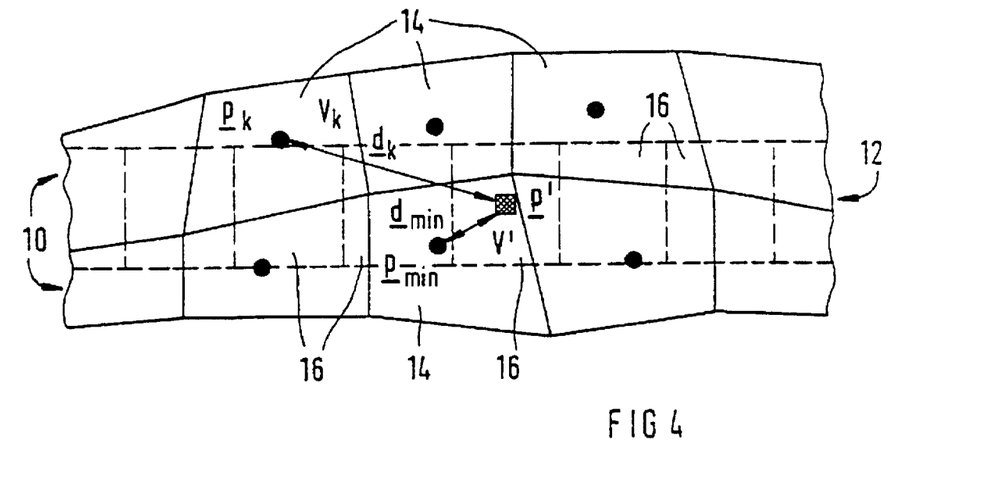
FIG. 4 is a schematic illustration for explaining a first embodiment of the inventive method for modified multiplanar reconstruction.

FIG. 4 details a nearest neighbor method which has been modified for 3D reconstruction. The volume elements 16 belonging to a planar slice 12 are situated within two curved slices 10. The center of gravity is taken as the representative $p_k$ of the original volume elements 14, for example. Likewise, the center of gravity p' is applied as the representative of the volume element 16. The original volume element 14 having the shortest distance $d_{min}=\min\{d_i, \ldots, d_n\}$ to the volume element to be reconstructed is then determined on the basis of the centers of gravity. The intensity value of the volume element 16 to be reconstructed is obtained by multiplying the intensity value of the nearest original volume element 14 by the ratio of the volume contents |V'| of the volume element 16 and the volume content $|V_k|$ of the original volume element 14, as a weighting factor according to $$i(p')=i(p_{min})|V'|/|V_k|.$$

Since, in contrast to the volume element 16, the original volume elements 14 are generally not limited to a plane in a straight line, the determination of the volume contents $V_k$ can be more complicated than in the case of simple geometric bodies. To save computing power, given low precision requirements, the conventional nearest neighbor method can be used, wherein corrections using weighting factors dependent on the volume contents of the participating volume elements 14, 16 do not occur.

Figure 5:
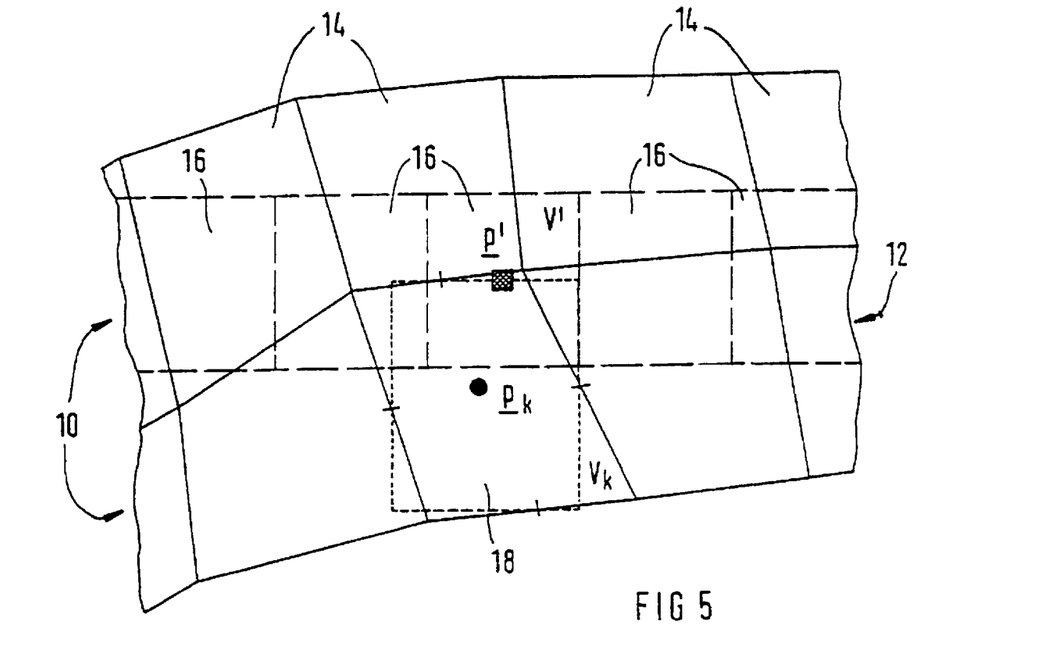
FIG. 5 is a schematic illustration describing the approximation of a curvilinearly bounded volume element based on geometric base bodies.

If, however, higher precision requirements must be satisfied, then approximating methods can be employed only given volumes $V_k$ that are extremely difficult to calculate analytically. One of these is the approximation of the volume contents with simple geometric base bodies, wherein the elementary size is determined by the specified precision. The simplest case is a volume determination by an approximation of the volume element by an elementary cuboid 18; for clarity, FIG. 5 outlines this for the two-dimensional case. The 3D case is analogous.

Another way to correct the deformed intensity is the use of an analytical term into which the gradient and main magnetic fields are entered. An intensity correction factor $I_c$, that is obtained directly from the magnetic field quantities, corresponds to the volume ratio of the reconstructed volume element 16 to the original volume element 14, and is calculated according to the following relation:

$$I_c(x,y,z)=A \cdot B \cdot C,$$

wherein $$A = \left| 1 + \frac{1}{G_x} \cdot \frac{\delta}{\delta x}(\Delta B(x, y, z) + B_x(x, y, z)) \right|$$

$$B = \left| 1 + \frac{1}{G_y} \cdot \frac{\delta}{\delta y} B_y(x, y, z) \right|$$

$$C = \left| 1 + \frac{1}{G_z} \cdot \frac{\delta}{\delta z} B_z(x, y, z) \right|$$

with the terms defined as follows:
x, y, z: the actual coordinates of the volume element, not the measured ones
ΔB: basic field inhomogeneity
$B_x$: gradient non-linearity in the frequency coding direction
$B_y$: gradient non-linearity in the phase coding direction
$B_z$: gradient non-linearity in the slice selection direction
$G_x$: field gradient in the frequency coding direction
$G_y$: field gradient in phase coding direction
$G_z$: field gradient in the slice selection direction The coordinates x, y, z define the location of the representative of the corresponding volume element. The intensity at this location is then multiplied by the factor $I_c$ in order to obtain a corrected intensity at the location of the reconstructed image element. As an approximation, the coordinates of a desired reference point can be employed instead of the coordinates of the nearest neighbor point.

Another MPR method of correction of the intensity values is known as the "trilinear algorithm". The conventional method can only process original image elements which are situated at intersections of a cubic grid, however. To achieve this, a curvilinear coordinate system Q is defined, in which the original image elements p are situated on a cubic grid. The points p' of the deformation-corrected image are also transformed according to Q by a transformation $T_Q$.

Figure 6:
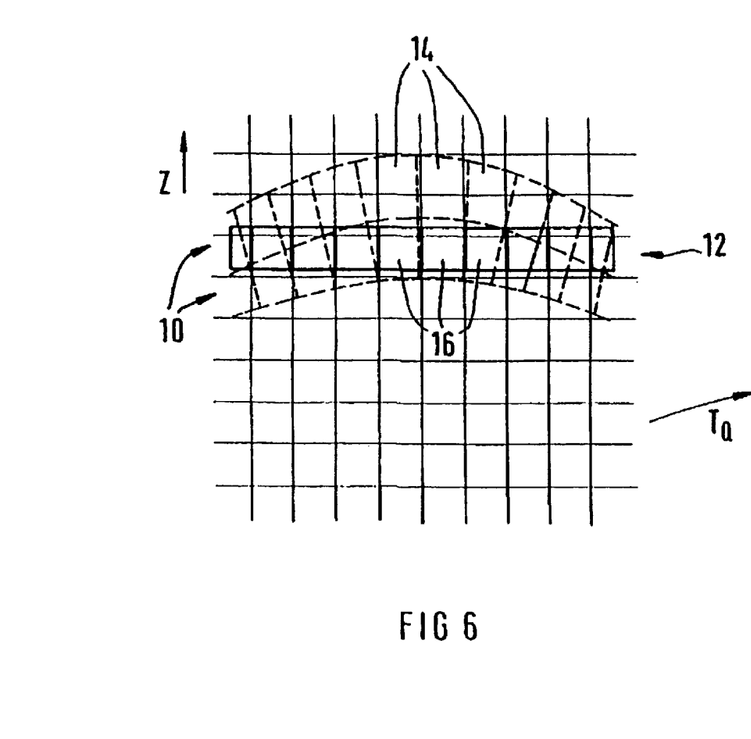
FIG. 6 is a schematic illustration of the non-planar and planar slices in a cubic grid.
Figure 7:
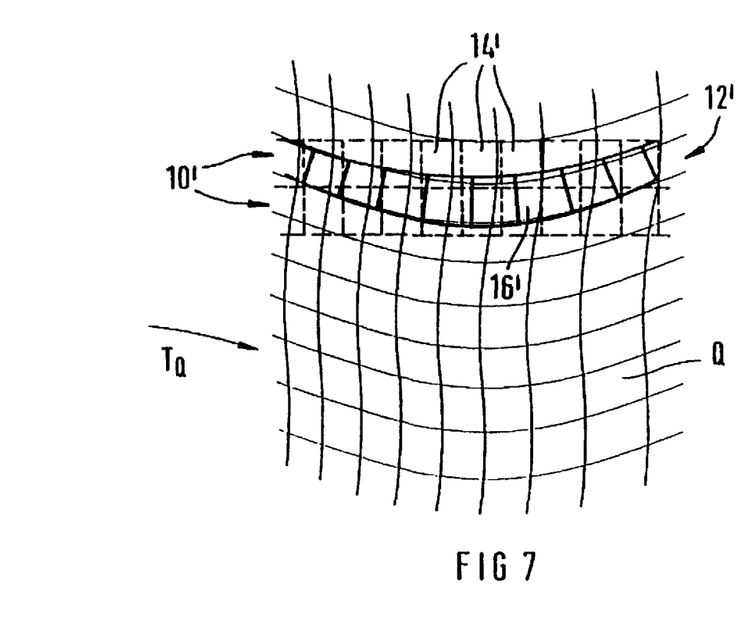
FIG. 7 is a schematic illustration of the non-planar and planar slices in a curvilinear grid subsequent to a transformation in accordance with the inventive method.

FIGS. 6 and 7 illustrate the transformation $T_Q$. FIG. 6 shows the original volume elements 14 and the reconstructed volume elements 16 in the Cartesian coordinate system. FIG. 7 likewise shows original volume elements 14' and reconstructed volume elements 16' in the curvilinear coordinate system Q. The local and generally non-linear transformation $T_Q$ can be defined as follows:

$$\underline{p}'_i = T_Q(\underline{p}'_i) \cdot \underline{p}_i = \begin{pmatrix} p_{ix} + (\Delta B(\underline{p}_i) + B_x(\underline{p}_i))/G_x \\ p_{iy} + (B_x(\underline{p}_i))/G_c \\ p_{iz} + (\Delta B(\underline{p}_i) + B_x(\underline{p}_i))/G_x \end{pmatrix} = \begin{pmatrix} p'_{ix} \\ p'_{iy} \\ p'_{iz} \end{pmatrix},$$

when there is phase coding in the y-direction. If the phase coding is in a different coordinate direction, the main field inhomogeneity $\Delta B(p_i)$ in this direction is not taken into consideration, because the main field inhomogeneity in the phase encoding direction basically does not deform the image elements. Gradient field non-linearities, however, do also affect the phase encoding direction.

The transformation $T_Q$ describes the allocation of vectors $p_i$ of the original vector field to the vectors $p'_i$ of the target vector field. The locality and non-linearity of the transformation $T_Q$ is contained in the inhomogeneous total field, which is additively composed of the inhomogeneous basic field $\Delta B(p_i)$ and the non-linearity of the gradient field $B_x(p_i), B_y(p_i), B_z(p_i)$. The two inhomogeneous field portions are usually given in a series representation, e.g. using Legendre polynomials.

By the transformation $T_Q$ of the image elements into the curvilinear coordinate system Q, the deformed measured slices 10 are transformed into planar slices 10', as can be seen in FIG. 7. The planar slice 12 is transformed into a curved slice 12' by the transformation $T_Q$.

Figure 8:
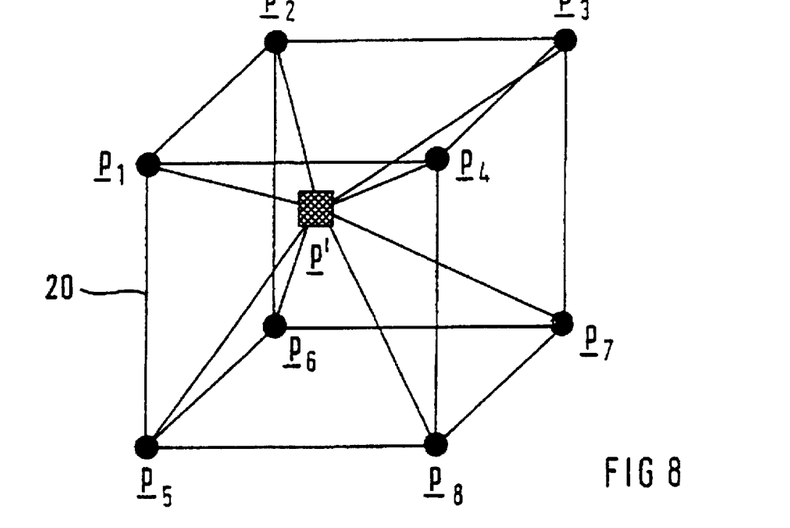
FIG. 8 is a schematic illustration for explaining a second embodiment of the inventive method for modified multiplanar reconstruction.
Figure 9:
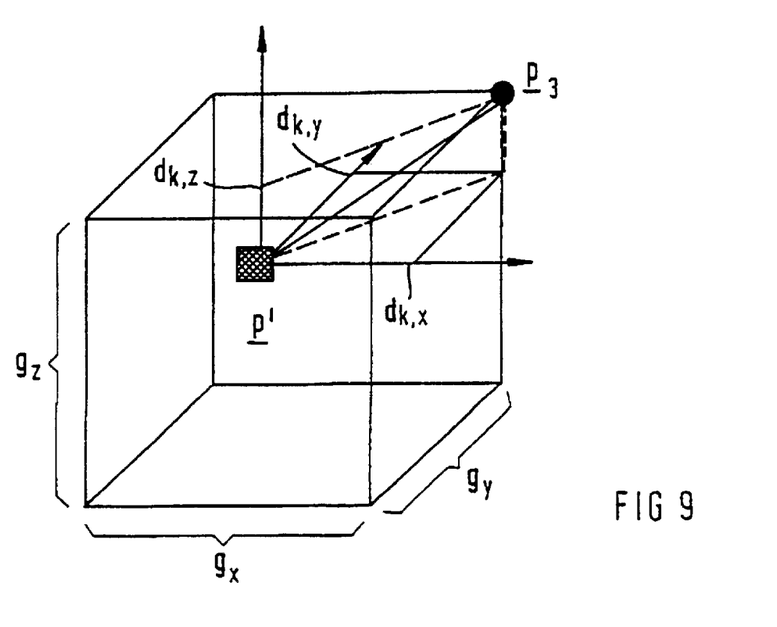
FIG. 9 is an illustration for explaining the determination of weighting factors which are used in the second embodiment of the inventive reconstruction method.

Conventional MPR methods which require a cubical basic grid can thus be used in order to determine the image elements of arbitrary slices. FIGS. 8 and 9 depict the geometric relations in the conventional trilinear algorithm that can be employed to approximately define the image elements to be reconstructed, in a curvilinear coordinate system, provided the precision requirements are not very high.

As representatives of the transformed original volume elements 14', points $p_1$ to $p_8$ represent the vertices of a grid element 20 of the cubic grid that exists after transformation, in which grid the image element p' to be reconstructed is located. The points $p_1$ to $p_8$ are the nearest points to p'. In the trilinear algorithm, the intensities $i(p_1)$ to $i(p_8)$ define the intensity of the reconstructed image element p' with corresponding weight factors. The equation $$i'(p') = a_1 i(p_1) + \ldots + a_8 i(p_8)$$

applies here, the weighting factors $a_k$ being determined from the projections $d_{kx}, d_{ky}, d_{kz}$ of the distance vector $d_k$ on the grid lines $g_x, g_y, g_z$. FIG. 9 clarifies these relations. The projections in the direction of the edges of the transformed original volume elements are as follows:

$$d_{kx} = |(p' - p_k) e_x|$$

$$d_{ky} = |(p' - p_k) e_y|$$

$$d_{kz} = |(p' - p_k) e_z|$$

The terms $e_x$, $e_y$ and $e_z$ represent the corresponding mutually perpendicular unit vectors.

The weight factors can be determined from the projections according to the following relation:

$$a_k = (g_x - d_{kx})(g_y - d_{ky})(g_z - d_{kz})$$

If the precision in the application of the conventional trilinear algorithm is not sufficient, a modified weight factor $a_k^{mod}$ is used, which accounts for the different volumes of the original image elements and of the reconstructed image elements. The weighting factor $a_k$ is modified in this regard by multiplying it by the ratio of the volume contents of the reconstructed volume element and the volume contents of the original volume element, according to the relation:

$$a_k^{mod} = |V'|/|V_k| a_k.$$

Figure 10:
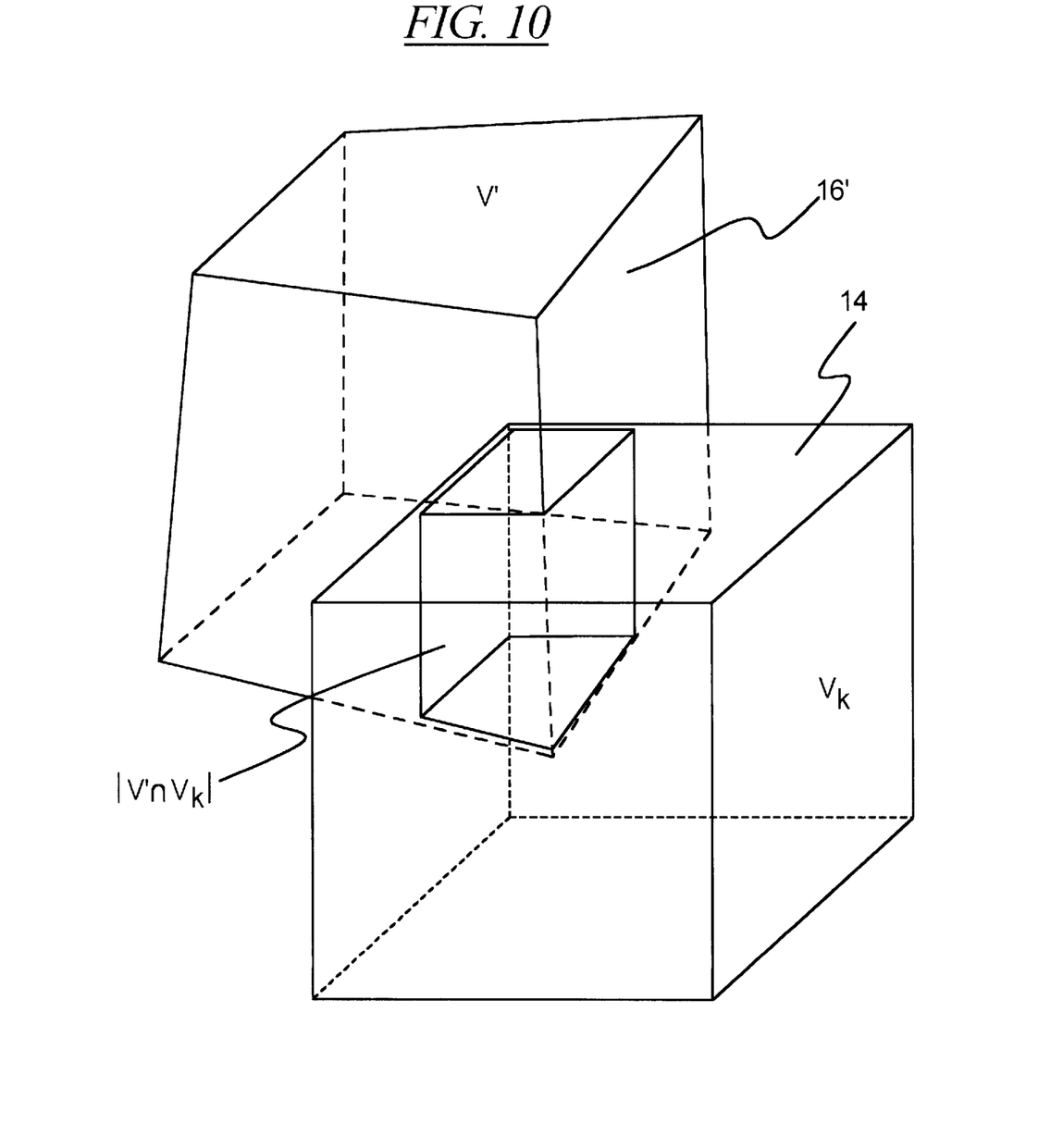
FIG. 10 is a schematic illustration for explaining a third embodiment of the inventive method for modified multiplanar reconstruction.

Another variant which is based on the calculation of the planar slice in the curvilinear coordinate system Q is illustrated in FIG. 10. The original volume elements are still in the cubic grid; the reconstructed volume element is limited in a curved line. According to this variation, the weighting factors for the corresponding intensities are defined by the ratio of the volume contents of the overlap volume $|V' \cap V_k|$ relative to the original volume element $|V_k|$, according to:

$$a_k^{mod} = |V' \cap V_k|/|V_k|.$$

The volumes $|V_k|$ of the original volume elements 14' are easier to determine. The reconstructed volume elements 16' are generally bounded curvilinearly, so that approximating methods are applied here only given volume contents which cannot be determined analytically or which can be so determined only with difficulty. One possibility is to approximate the volume contents by small geometric base bodies, as explained above.

Finally, the intensity correction with the previously indicated factor $I_c(x, y, z)$ can be performed. The intensities of the eight nearest original image elements are respectively multiplied by the corresponding intensity correction factor. As in the conventional trilinear algorithm, the intensity values of these points then enter into the intensity, which is to be calculated, of the reconstructed image weighted according to their distance.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for reconstructing a planar tomogram of an examination subject from magnetic resonance signals in an inhomogeneous magnetic field with a magnetic resonance device having at least one of a known inhomogeneous main magnetic field and a known non-linear gradient magnetic field, comprising the steps of:

generating original image elements by multi-slice excitation of the examination subject, the original image elements being generated from magnetic resonance signals of original volume elements, said original volume elements being disposed in the examination subject in several curved slices which are adjacent to one another in succession;

determining a spatial position of the original image elements by means of the known magnetic fields; and generating image elements of a planar tomogram which are representative of volume elements of a planar slice situated within the curved slice, from the original image elements that are arranged in an environment of the respective image elements.

2. A method according to claim 1, wherein the respective image have intensity values, and the original image elements respectively have original intensity values, and comprising generating the intensity values from surrounding original intensity values, which are weighted with allocated weight factors.

3. A method according to claim 2, comprising defining the weighting factors by a distance value which represents the distance of the image element from the original image elements.

4. A method according to claim 3, wherein only the nearest original image element respectively defines the image element.

5. A method according to claim 2 comprising defining the weighting factors by corresponding volume contents of the original volume element and of the volume element.

6. A method according to claim 5, comprising determining the respective weighting factors as a ratio of the volume contents of the volume element relative to the volume contents of the original volume element.

7. A method according to claims 2 comprising determining the weighting factors from the gradient and main magnetic fields at the location of the volume element.

8. A method according to claim 5, comprising forming the respective weighting factors by the volume contents of an overlap volume of the volume element and the original volume element relative to the original volume element.

9. A method according to claim 2, comprise forming the weighting factors from partial derivatives of at least one of the basic field inhomogeneities and the gradient field non-linearities at the location of the corresponding volume elements.

10. A method according to claim 9, comprising forming the weighting factors according to the relation A·B·C, wherein $$A = \left| 1 + \frac{1}{G_x} \cdot \frac{\delta}{\delta x}(\Delta B(x, y, z) + B_x(x, y, z)) \right|$$

$$B = \left| 1 + \frac{1}{G_y} \cdot \frac{\delta}{\delta y} B_y(x, y, z) \right|$$

$$C = \left| 1 + \frac{1}{G_z} \cdot \frac{\delta}{\delta z} B_z(x, y, z) \right|$$

and wherein x, y, z: are the actual coordinates of the volume element, $\Delta B$: is the basic field inhomogeneity, $B_x$: is the gradient non-linearity in a frequency encoding direction, $B_y$: is the gradient non-linearity in a phase encoding direction, $B_z$: is the gradient non-linearity in a slice selection direction, $G_x$: is the field gradient in the frequency coding direction, $G_y$ is the field gradient in the phase encoding direction, and $G_z$: is the field gradient in the slice selection direction.

11. A method according to claim 1 comprising transforming the original image elements into a curvilinear coordinate system in which the original image elements are arranged on a cubic raster, also transforming the image elements of the planar slice into the curvilinear coordinate system, and forming the weighting factors as a ratio of the volume contents of the volume element relative to the volume contents of the original volume element.

* * * * *